(12) United States Patent
Zhang

(10) Patent No.: US 6,856,171 B1
(45) Date of Patent: Feb. 15, 2005

(54) SYNCHRONIZATION OF PROGRAMMABLE MULTIPLEXERS AND DEMULTIPLEXERS

(75) Inventor: Fulong Zhang, Willow Grove, PA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 19 days.

(21) Appl. No.: 10/460,385

(22) Filed: Jun. 11, 2003

(51) Int. Cl.[7] .................................................. H03K 19/00
(52) U.S. Cl. ........................................... 326/93; 326/46
(58) Field of Search ................................ 326/93–98, 37, 326/38, 46

(56) References Cited

U.S. PATENT DOCUMENTS 5,675,808 A * 10/1997 Gulick et al. ............... 713/322
6,133,750 A * 10/2000 Chan et al. .................... 326/41
6,744,289 B2 * 6/2004 Nguyen et al. .............. 327/115

* cited by examiner

Primary Examiner—Don Le
(74) Attorney, Agent, or Firm—MacPherson Kwok Chen & Heid LLP; Greg J. Michelson

(57) ABSTRACT

Systems and methods are disclosed to provide clock and data synchronization for input/output interfaces of a programmable logic device. In accordance with one embodiment, a phase-locked loop or a delay-locked loop is employed to synchronize signals for input/output circuitry. In accordance with another embodiment, a clock divider along with an edge clock distribution scheme is employed to distribute clock and reset signals for input/output circuitry.

13 Claims, 13 Drawing Sheets

SYNCHRONIZATION OF PROGRAMMABLE MULTIPLEXERS AND DEMULTIPLEXERS

TECHNICAL FIELD

The present invention relates generally to electrical ircuits and, more particularly, to synchronization of istributed multiplexers and demultiplexers utilized in input/output circuits of programmable logic devices.

BACKGROUND

Programmable logic devices (e.g., complex programmable logic devices or field programmable gate arrays) are well known in the art. Programmable logic devices (PLDs) can potentially handle a wide range of input/output interface standards, because of their flexible programmable circuitry.

A drawback of PLDs is that their performance is generally limited due to the nature of their flexible, programmable core logic circuitry. To support high-speed input/output interface standards that exceed the speed (e.g., clock rate) of a PLD's core logic, the PLD must have a high-speed to low-speed input/output interface. This interface, for example, may employ programmable multiplexer and/or demultiplexer circuits (also known as mux/demux circuits).

However, because typically input/output circuits on the PLD are programmable, along with clock and data paths (e.g., placement of a particular bus is done by a user resulting in a variable location and/or path for the bus), the synchronization of the distributed multiplexers/demultiplexers associated with the input/output circuits is often very difficult. As a result, there is a need to provide systems and methods for providing synchronization of multiplexers/demultiplexers across input/output circuits of programmable logic devices.

SUMMARY

Systems and methods are disclosed herein to provide synchronization for input/output interfaces within a programmable logic device. For example, in accordance with one embodiment of the present invention, a phase-locked loop or a delay-locked loop is employed to synchronize clock signals provided to input/output interfaces of a programmable logic device. As another example, in accordance with another embodiment of the present invention, a clock divider is employed along with an edge clock distribution scheme to distribute clock and reset signals to input/output interfaces of a programmable logic device.

More specifically, in accordance with one embodiment of the present invention, a programmable logic device includes a first set of registers adapted to receive data; a second set of registers coupled to the first set of registers and adapted to receive the data under control of an update signal; and a third set of registers coupled to the second set of registers and adapted to receive the data and provide the data at a desired clock rate.

In accordance with another embodiment of the present invention, a method of synchronizing a plurality of input/output circuits within a programmable logic device includes receiving data and clocking the data into a first set of registers; shifting the data to a second set of registers under control of an update signal, wherein the update signal is synchronized across the plurality of input/output circuits; and shifting the data from the second set of registers to a third set of registers adapted to receive the data and provide the data at a desired clock rate.

In accordance with another embodiment of the present invention, a programmable logic device includes a clock divider circuit adapted to receive a first clock signal and a first reset signal and provide a second reset signal synchronized to the first clock signal; a plurality of input/output circuits each adapted to receive the second reset signal and the first clock signal and synchronize the second reset signal to the first clock signal to generate a local synchronization signal, wherein the local synchronization signal in each of the plurality of input/output circuits is synchronized to a clock cycle of the first clock signal; a first distribution path for the first clock signal, the first distribution path couplable between the clock divider circuit and the plurality of input/output circuits; and a second distribution path for the second reset signal, the second distribution path couplable between the clock divider circuit and the plurality of input/output circuits.

In accordance with another embodiment of the present invention, a method of synchronizing a plurality of input/output circuits on a programmable logic device includes receiving a first reset signal and a first clock signal; generating a second reset signal synchronized to the first clock signal; transmitting the first clock signal and the second reset signal through a first distribution path and a second distribution path, respectively, to the plurality of input/output circuits; and synchronizing the second reset signal to the first clock signal at each of the plurality of input/output circuits to generate a local synchronization signal.

In accordance with another embodiment of the present invention, a programmable logic device includes a feedback circuit adapted to synchronize a first clock signal and a second clock signal; and a plurality of input/output circuits couplable to the feedback circuit, with each adapted to receive the first and second clock signals from the feedback circuit and a first reset signal and synchronize the first reset signal to the second clock signal to generate a second reset signal which is synchronized to the first clock signal to generate a local synchronization signal.

In accordance with another embodiment of the present invention, a method of synchronizing a plurality of input/output circuits on a programmable logic device includes synchronizing a first clock signal to a second clock signal; transmitting the first and second clock signals and a first reset signal to the plurality of input/output circuits; synchronizing the first reset signal to the second clock signal to generate a second reset signal; and synchronizing the second reset signal to the first clock signal to generate a local synchronization signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
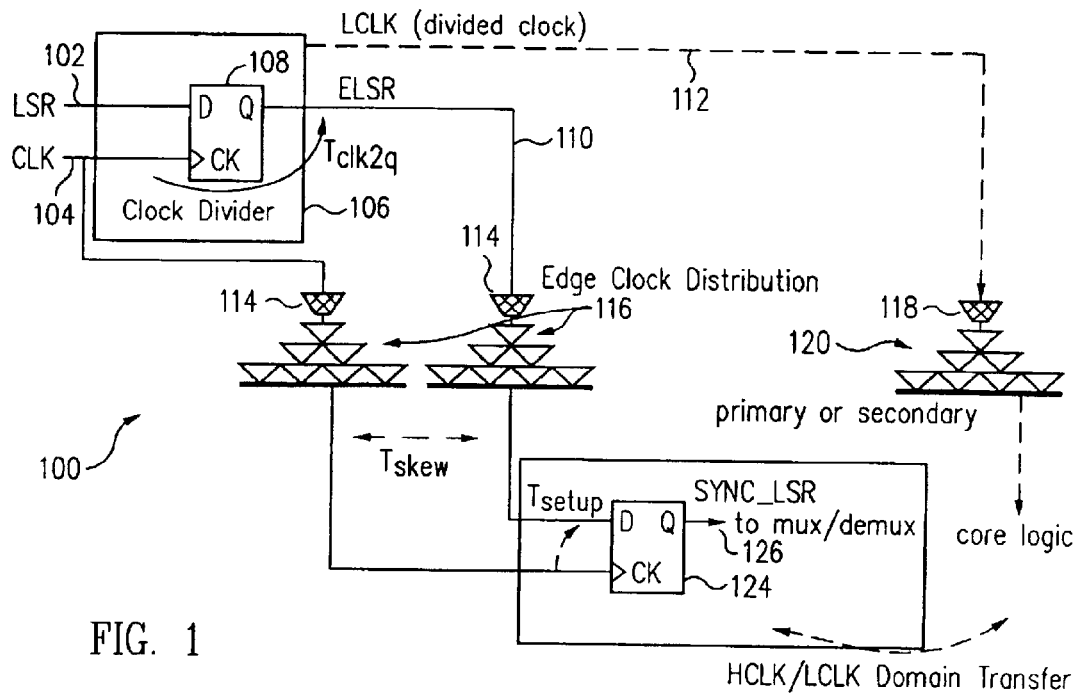
FIG. 1 shows a block diagram illustrating a clock synchronization scheme in accordance with an embodiment of the present invention.

FIG. 1 shows a block diagram illustrating a clock synchronization scheme (CSS) 100 in accordance with an embodiment of the present invention. CSS 100 includes a clock divider 106 and distribution paths 116 for a clock (CLK) signal 104 and an edge clock reset signal (ELSR) 110, respectively. In general, CSS 100 distributes clock signal 104 (a high speed clock) and edge clock reset signal 110 (a reset signal) in parallel using two edge clock paths.

Clock signal 104 and edge clock reset signal 110, for example, propagate through high-speed clock networks at very high speeds (e.g., GHz) along an edge of the programmable logic device to synchronize all of the associated input/output interface circuits. Specifically, clock divider 106 receives a reset signal (LSR) 102 and clock signal 104, which controls the clocking of reset signal 102 (via exemplary flip flop 108) to generate edge clock reset signal 110.

Clock divider 106 also generates clock (LCLK) signal 112, which is a lower frequency (divided clock) clock that is synchronized to clock signal 104 (a high-speed clock). Clock signal 112 propagates through a multiplexer 118 and a distribution path 120 to a core logic of the programmable logic device. The injection time of clock signal 112 may, in general, be greater than clock signal 104. However, the difference may be bounded for a given programmable logic device or programmable logic device family. Thus, the data output from the input/output circuits are synchronized and a reliable clock domain transfer occurs between input/output circuits and the core logic of the programmable logic device for bounded clock injection differences between clock signal 112 and clock signal 104.

Figure 2:
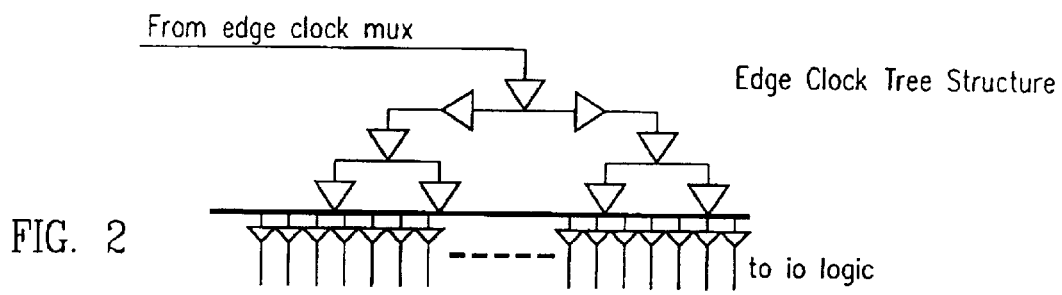
FIG. 2 shows a block diagram illustrating a clock tree structure in accordance with an embodiment of the present invention.

Clock signal 104 and edge clock reset signal 110 propagate through substantially identical paths via corresponding multiplexers 114 and distribution paths 116 to arrive approximately at the same time at input/output interfaces of the programmable logic device (which includes CSS 100). Multiplexers 114 and distribution paths 116 represent the programmable circuitry and routing resources that a user may select to route the signals to the input/output interfaces. As an example, FIG. 2 illustrates an exemplary three-level binary edge clock tree structure suitable for distribution path 116. The tree structure receives clock signal 104 or edge clock reset signal 110 via multiplexer 114 and distributes the signal to the input/output interfaces.

Returning to FIG. 1, a flip flop 124 at each of the input/output interfaces receives edge clock reset signal 110. Flip flop 124 is clocked by clock signal 104 to generate a synchronization signal (SYNC_LSR) 126 that is utilized by the input/output interface and by using this technique results in all of the input/output interfaces utilizing edge clock reset signal 110 being synchronized to each other. For example, synchronization signal 126 may be used by each of the input/output interfaces to generate update signals, which are used to time serial-to-parallel or parallel-to-serial data transfer. Further details regarding input/output interfaces and an exemplary input/output interface utilizing multiplexers and demultiplexers that could utilize synchronization signal 126 (based on techniques discussed herein) can be found in U.S. Pat. No. 6,472,904, which is incorporated herein by reference in its entirety.

Synchronization signal 126 is synchronized to the same clock cycle of clock signal 104 across the input/output interfaces associated with the same distribution path 116 as long as, in general, the following timing constraint is satisfied.

$$T_{clk2q} + T_{setup} + T_{skew} + T_{jitter} < T_{cycle}$$

where $T_{clk2q}$ is the clock to Q delay of flip flop 108 to produce edge clock reset signal 110, $T_{skew}$ is the setup time for flip flop 124 to register edge clock reset signal 110, $T_{skew}$ is the maximum skew between clock signal 104 and edge clock reset signal 110 propagating through distribution paths 116, $T_{jitter}$ is the jitter for clock signal 104 (which results in a narrowing of the clock cycle window), and $T_{cycLe}$ is the cycle time for clock signal 104.

Clock signal 112 propagates through multiplexer 118 and distribution path 120 that may be matched or substantially longer or shorter than the path taken by clock signal 104 and edge clock reset signal 110. The difference in time ($T_{injdiff}$) may be relieved by moving edges of clock signal 112 relative to an edge of an update signal in each of the input/output circuits to maximize setup/hold timing margins for clock domain transfer (e.g., illustrated in FIG. 12). Consequently, a proper high-speed clock (i.e., clock signal 104) to a low-speed clock (i.e., clock signal 112) domain transfer can be established and maintained. Thus, clock signal 112, which is received by core logic of the programmable logic device, is synchronized with data (i.e., data bits, control bits, or other types of information) transferred via the input/output interface circuits.

As described above, clock divider 106 generates a divided low speed clock (clock signal 112) that is distributed to the core logic of the programmable logic device. In accordance with an embodiment of the present invention, clock divider 106 can shift the phase of clock signal 112 relative to clock signal 104 (high-speed clock) by 180 degrees for a divide by two mode or 90, 180, or 270 degrees for a divide by four mode. The phase may be chosen to maximize a margin for clock domain transfer between the input/output interfaces and the core logic. By knowing or by placing a lower and an upper bound on the delay relationship, the clock transfer between the two clock domains may be performed correctly.

Figure 3:
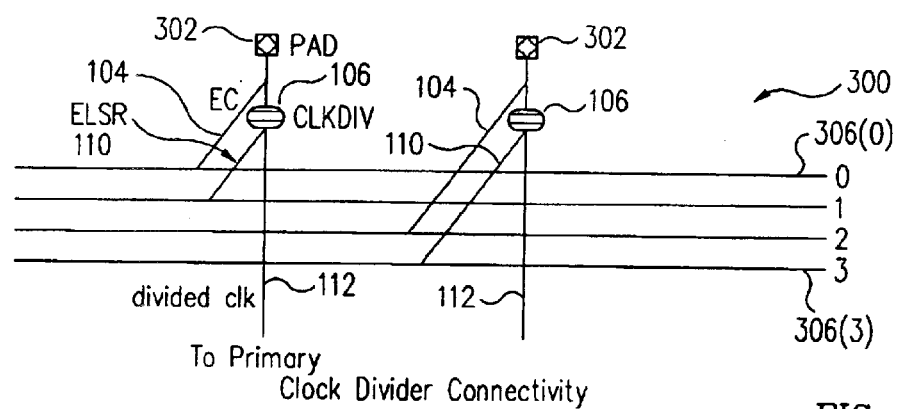
FIG. 3 shows a block diagram illustrating connectivity for a clock divider in accordance with an embodiment of the present invention.

As an example, FIG. 3 illustrates connectivity for clock dividers 106 within a programmable logic device. In this example, there are two clock dividers 106 that receive clock signal 104 (high-speed clock labeled EC (edge clock)) via pads 302 and generate edge clock reset signal 110 and clock signal 112 (low speed clock distributed to the core logic as a primary clock). There may be, for example, two clock dividers 106 per edge of the programmable logic device (i.e., eight clock dividers total within the programmable logic device). Clock signal 104 and edge clock reset signal 110 are distributed to the input/output interfaces via paths 306 (which are separately referenced as paths 306(0) through 306(3)). As shown, paths 306(0) and 306(1) are used to carry clock signal 104 and edge clock reset signal 110, respectively, for one of clock dividers 106, while paths 306(2) and 306(3) are used to carry clock signal 104 and edge clock reset signal 110, respectively, for the other one of clock dividers 106.

Figure 4:
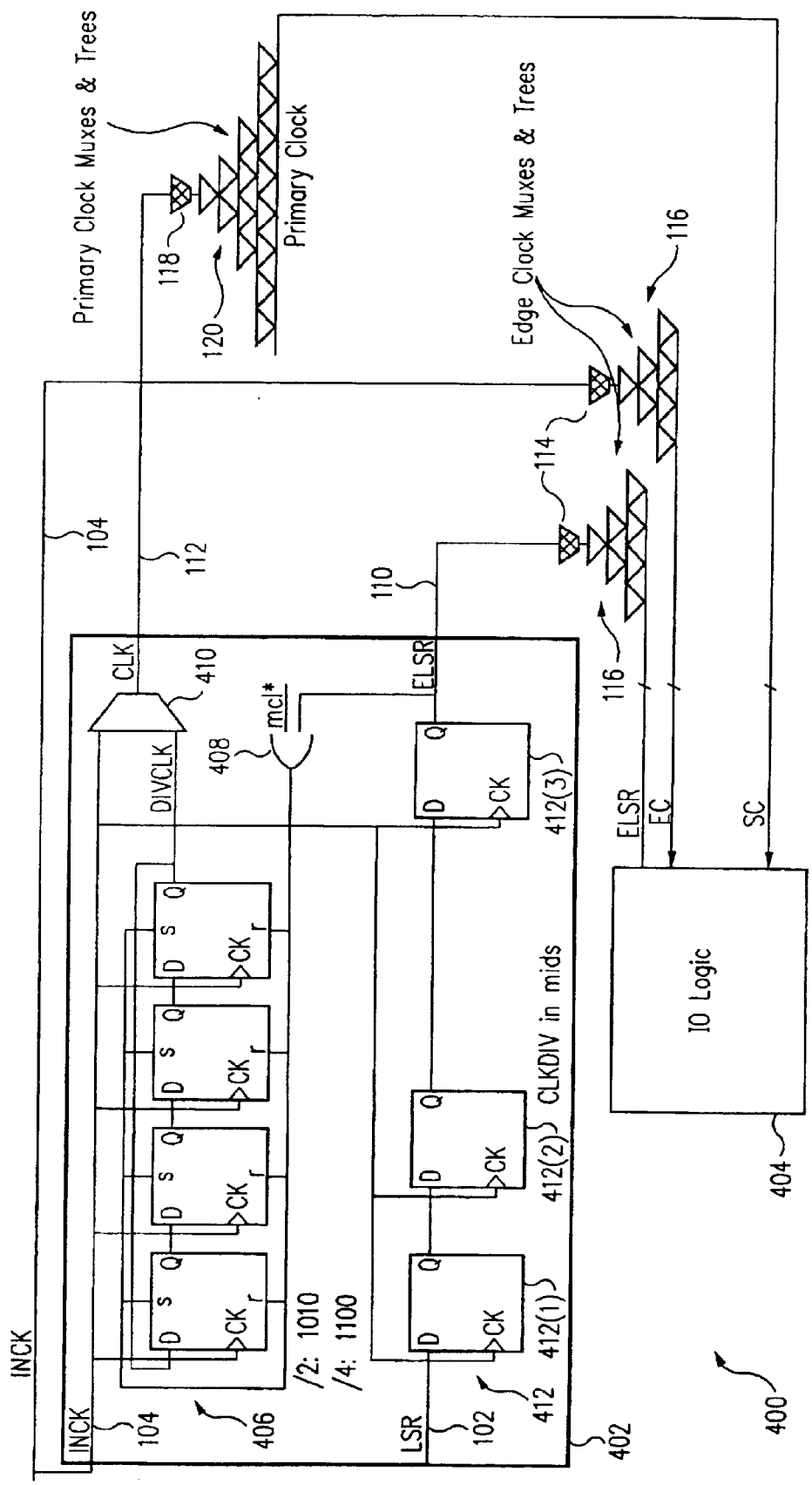
FIG. 4 shows a block diagram illustrating an exemplary clock divider for the clock synchronization scheme of FIG. 1.

FIG. 4 shows a block diagram illustrating a clock synchronization scheme (CSS) 400. CSS 400 is similar to CSS 100 and therefore only general differences will be noted.

Clock divider 402 illustrates exemplary circuitry for clock divider 106 of FIG. 1. For this example, clock divider 402 includes four flip flops 406 used to divide clock signal 104 by two or four, which can be set by control logic 408 (e.g., control logic 408 settings of 0000, 1010, and 1100 results in no division, divide by two, or divide by four, respectively). A multiplexer 410 selects between clock signal 104 and clock signal 104 divided by flip flops 406 as the clock signal to provide as clock signal 112.

Reset signal 102 propagates through flip flops 412, which are clocked by clock signal 104, to generate edge clock reset signal 110. Flip flops 412 (which are separately referenced as flip flops 412(1) through 412(3)) greatly reduce the possibility of metastability, for example, when reset signal 102 cannot be guaranteed to be synchronized to clock signal 104. Edge clock reset signal 110 and clock signal 104 are provided through similar paths to input/output logic 404 (input/output interface) to synchronize data input/output signals (e.g., synchronization of multiplexers and demultiplexers of input/output logic 404). Clock signal 112 is provided to the core logic and may also be provided to input/output logic 404 for clock domain transfer.

Figure 5:
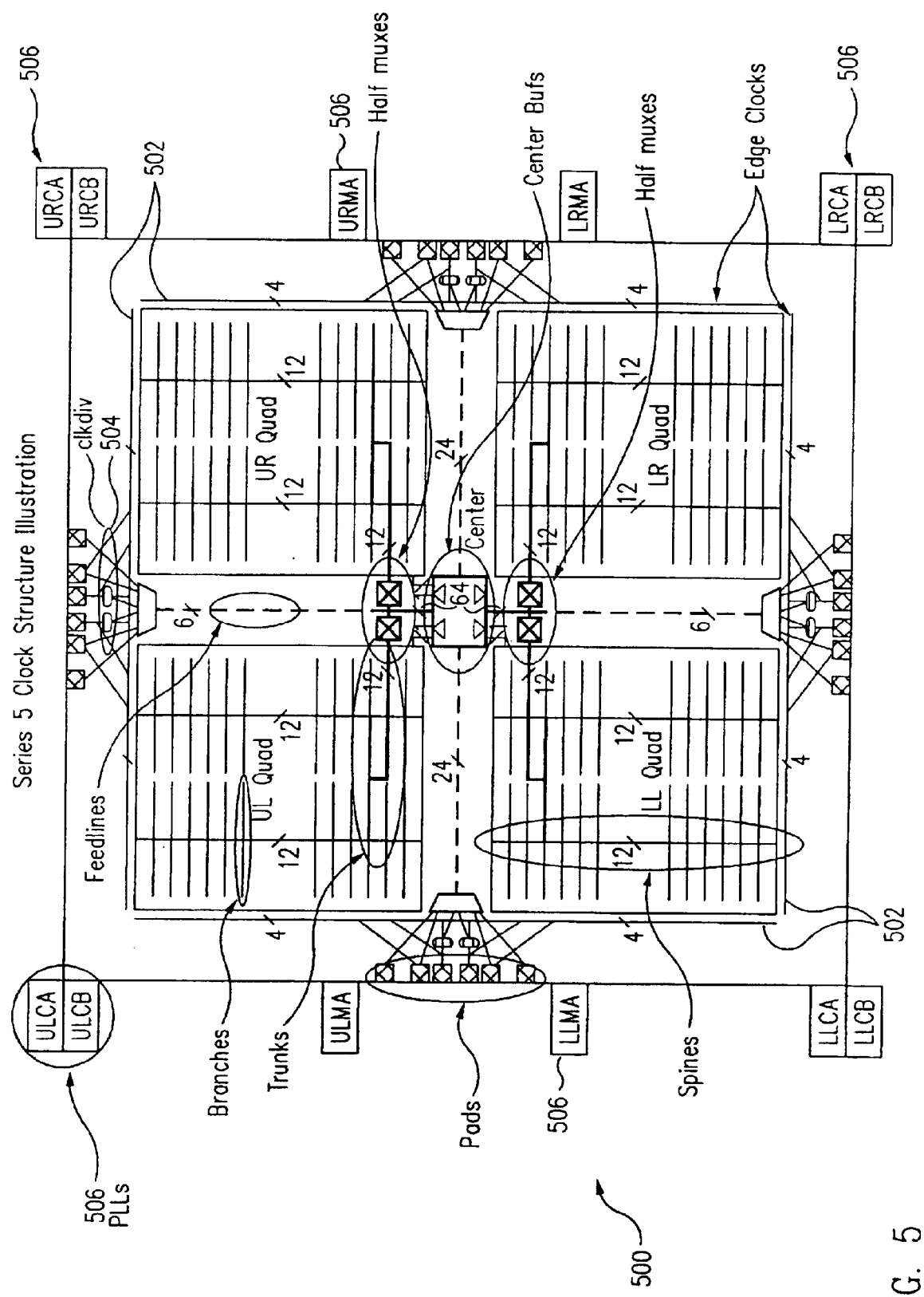
FIG. 5 shows a block diagram illustrating a programmable logic device with an exemplary clock distribution structure and synchronization scheme in accordance with an embodiment of the present invention.

FIG. 5 shows a block diagram of a programmable logic device (PLD) 500 (e.g., a field programmable gate array) that illustrates an exemplary clock distribution structure and synchronization scheme in accordance with an embodiment of the present invention. PLD 500 is divided into four quadrants and includes feedlines, buffers, multiplexers, trunks, spines, and branches to route clock signals throughout PLD 500. As shown, there are four edge clock paths 502 and two clock dividers 504 per edge of PLD 500 to implement techniques of an edge clock distribution scheme as discussed herein. There are also a number of phase-locked loops 506 that may be utilized for various functions, including as discussed herein for synchronization of input/output interfaces.

Figure 6:
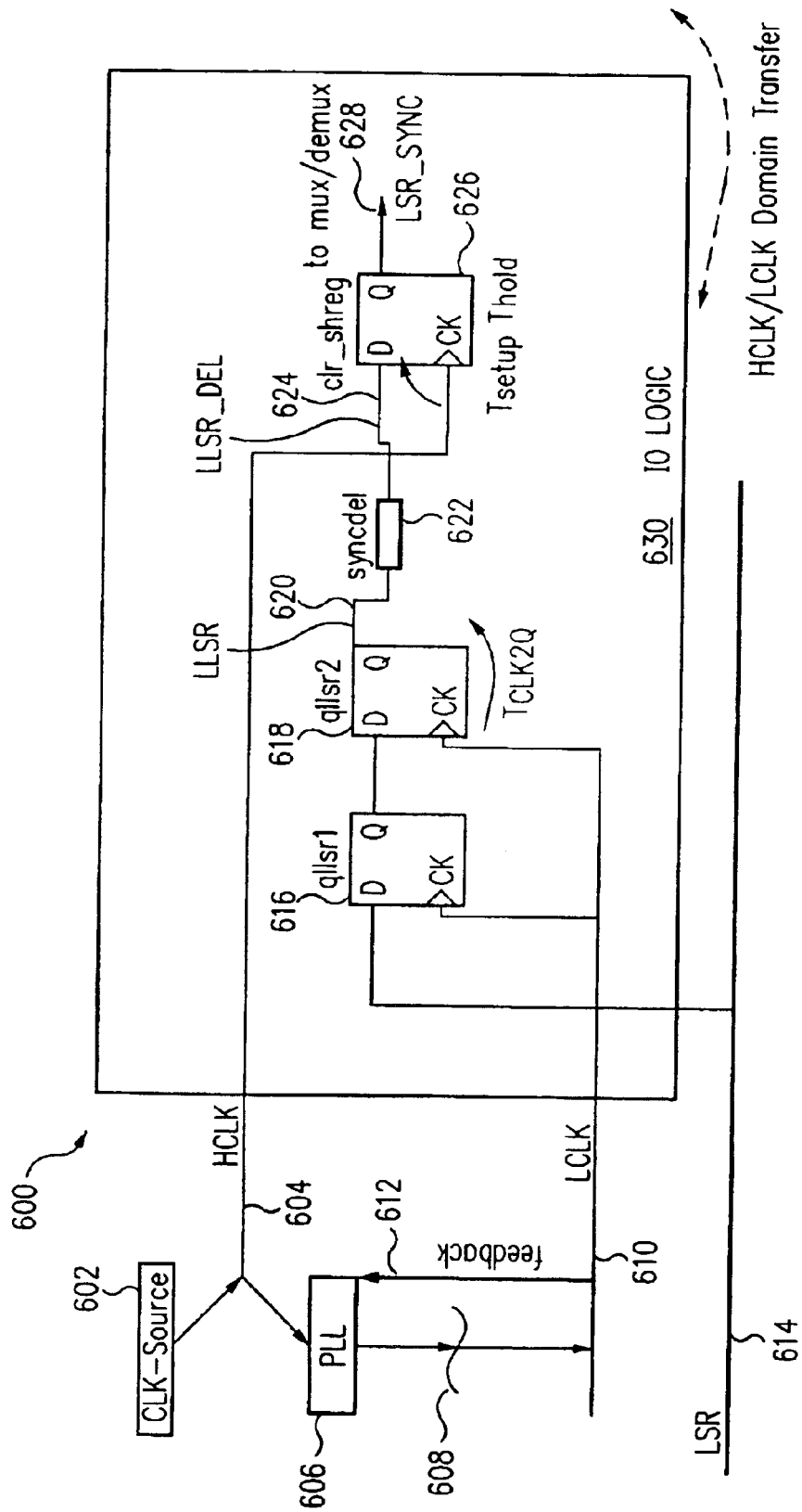
FIG. 6 shows a block diagram illustrating a clock synchronization scheme in accordance with an embodiment of the present invention.

For example, FIG. 6 shows a block diagram illustrating a clock synchronization scheme (CSS) 600 in accordance with an embodiment of the present invention. CSS 600 includes a phase-locked loop (PLL) 606, clock signals 604 and 610, and a reset signal (LSR) 614. In general, PLL 606 (or alternatively a delay-locked loop) aligns the phase of a high-speed clock (i.e., clock signal 604) with a low-speed clock (i.e., clock signal 610). Reset signal 614 is routed to individual input/output interfaces via the PLD's routing structure and synchronized to clock signal 610. The phase relationship between clock signals 604 and 610 is used to generate a local synchronization signal (LSR_SYNC) 628 "n" cycles after a clock edge of clock signal 610 (low-speed clock). Consequently, if "n" is constant across the input/output interfaces, then the input/output interfaces are synchronized.

Specifically, a clock source 602 provides clock signal 604 to PLL 606 and to the input/output interfaces associated with PLL 606. As an example, an input/output logic circuit 630 illustrates a portion of the circuitry of each of the input/output interfaces. PLL 606 generates clock signal 610 based on clock signal 604, with clock signal 610 propagating through a delay 608 (which may be unknown) prior to arriving at input/output logic circuit 630. A feedback signal 612 is provided, prior to input/output logic circuit 630, to PLL 606.

Input/output logic circuit 630 receives reset signal 614 at a flip flop 616, which is clocked by clock signal 610. A flip flop 618 follows flip flop 616 and is also clocked by clock signal 610 to generate a reset signal (LLSR) 620, which propagates through a delay element (syncdel) 622, to become a reset signal (LLSR_DEL) 624. A flip flop 626 receives reset signal 624 and is clocked by clock signal 604 to generate local synchronization signal 628.

Local synchronization signal 628 may be used, for example, to synchronize multiplexers and demultiplexers within the input/output interface. A clock domain transfer will be maintained between the input/output interfaces operating at a data rate associated with clock signal 604 and core logic of the programmable logic device operating at a data rate associated with clock signal 610 (i.e., high-speed/low-speed clock domain transfer, as illustrated).

In this embodiment, PLL 606 utilizes clock signal 604 (a high-speed clock) to generate clock signal 610 (a low-speed clock). Alternatively, clock signal 610 may be utilized to generate clock signal 604 or a reference clock may be used to generate clock signal 604 and clock signal 610. Furthermore, a DLL may be substituted for PLL 606 to phase align clock signals 604 and 610.

In general, reset signal 614 is routed to the input/output interfaces via the PLD's routing structure. The timing of reset signal 614 may or may not be within one clock cycle. Double registering (i.e., flip flops 616 and 618) is used to reduce the possibility of metastability of flip flops 616 and 618 for the case of reset signal 614 being non-synchronized. Delay element 622 is situated before flip flop 626 to guarantee setup and hold time margins for the clock domain transfer of reset signal 624 to local synchronization signal 628.

Figure 7:
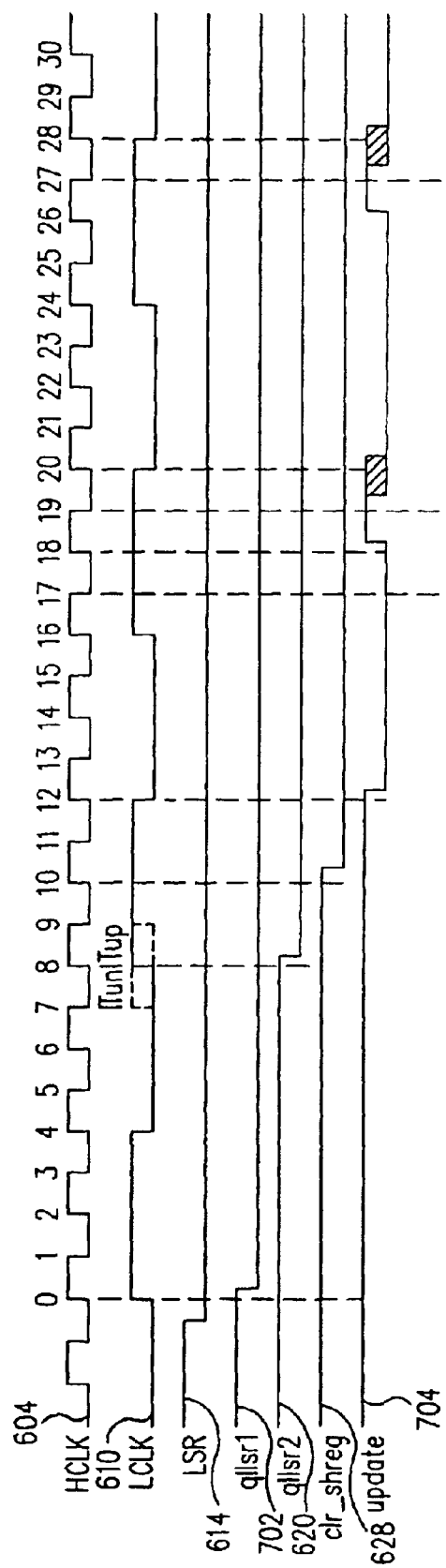
FIG. 7 shows an exemplary timing diagram for the clock synchronization scheme of FIG. 6.

FIG. 7 shows an exemplary timing diagram for CSS 600 of FIG. 6. The timing diagram illustrates exemplary waveforms for various signals described herein. As shown, exemplary waveforms are given for clock signals 604 and 610, reset signals 614 and 620, and local synchronization signal 628. Reset signal 620 is provided by flip flop 618 (labeled qllsr2) and local synchronization signal 628 is provided by flip flop 626 (labeled clr_shreg) as described in reference to and shown in FIG. 6. Additionally in FIG. 7, a waveform 702 is shown that corresponds to an output signal from flip flop 616 (labeled qllsr1) and a waveform 704 is shown for an update signal that may be utilized by the input/output interfaces as described in further detail herein.

The timing constraints (FIGS. 6 and 7) may be defined by the following equations:

$$T_{up} + T_{clk2q} + T_{sycndel} + T_{setup} < T_{cycle} \quad (1)$$

$$T_{clk2q} + T_{syncdel} > T_{un} + T_{hold} \quad (2)$$

where $T_{clk2q}$ is the clock to Q delay for flip flop 618, $T_{sycndel}$ is the delay of delay element 622, $T_{setup}$ is the setup time for flip flop 626, $T_{hold}$ is the hold time for flip flop 626, $T_{cycle}$ is the cycle time for clock signal 604, $T_{up}$ is the maximum amount of time that clock signal 610 lags behind clock signal 604 (i.e., positive uncertainty), and $T_{un}$ is the maximum amount of time that clock signal 610 rises before the rising edge of clock signal 604 (negative uncertainty).

As shown in FIG. 7, flip flop 626 will capture data from flip flop 618 on clock edge 10 of clock signal 604 rather than on clock edge 8 of clock signal 604, which is when flip flop 618 captures reset signal 614 due to rising edge of clock signal 610. Note that due to the phase alignment of clock signals 604 and 610, the $T_{up}$ and the $T_{un}$ timing measurements will nominally be approximately zero. However, there will be clock skew on clock signals 604 and 610 across the bus, clock jitter on both of clock signals 604 and 610, and also injection time differences for clock signals 604 or 610 to the input/output interfaces relative to PLL 606 (or a DLL), depending upon whether clock signal 604 or clock signal 610 is utilized to provide the feedback signal (e.g., feedback signal 612).

In general, after analysis of the clock relationship to predict the $T_{up}$ and the $T_{un}$ timing measurements, a circuit design may be selected to provide a proper delay for delay element 622 to guarantee the desired timing constraints (based on equations 1 and 2 above). Delay element 622 may be made programmable to more easily set the desired timing constraints. For example, delay element 622 may be set to avoid hold violations (e.g., must not capture at clock edge 8—FIG. 7) and also avoid setup violations (e.g., must capture at clock edge 10—FIG. 7). Furthermore, programmable fine delays may be provided at the input path or the feedback path (carrying feedback signal 612) of PLL 606 to null the clock alignment reminder or errors or move clock edges to some small degree.

As noted above, after reset signal 614 is received by input/output logic circuit 630 (part of the input/output interface), local synchronization signal 628 may be generated by flip flop 626 and utilized by the input/output interface (e.g., to synchronize multiplexer and demultiplexer activity). Due to the phase alignment between clock signals 604 and 610 (high and low speed clock signals, respectively), the clock transfer for data between clock signals 604 and 610 may be properly maintained.

Figure 8:
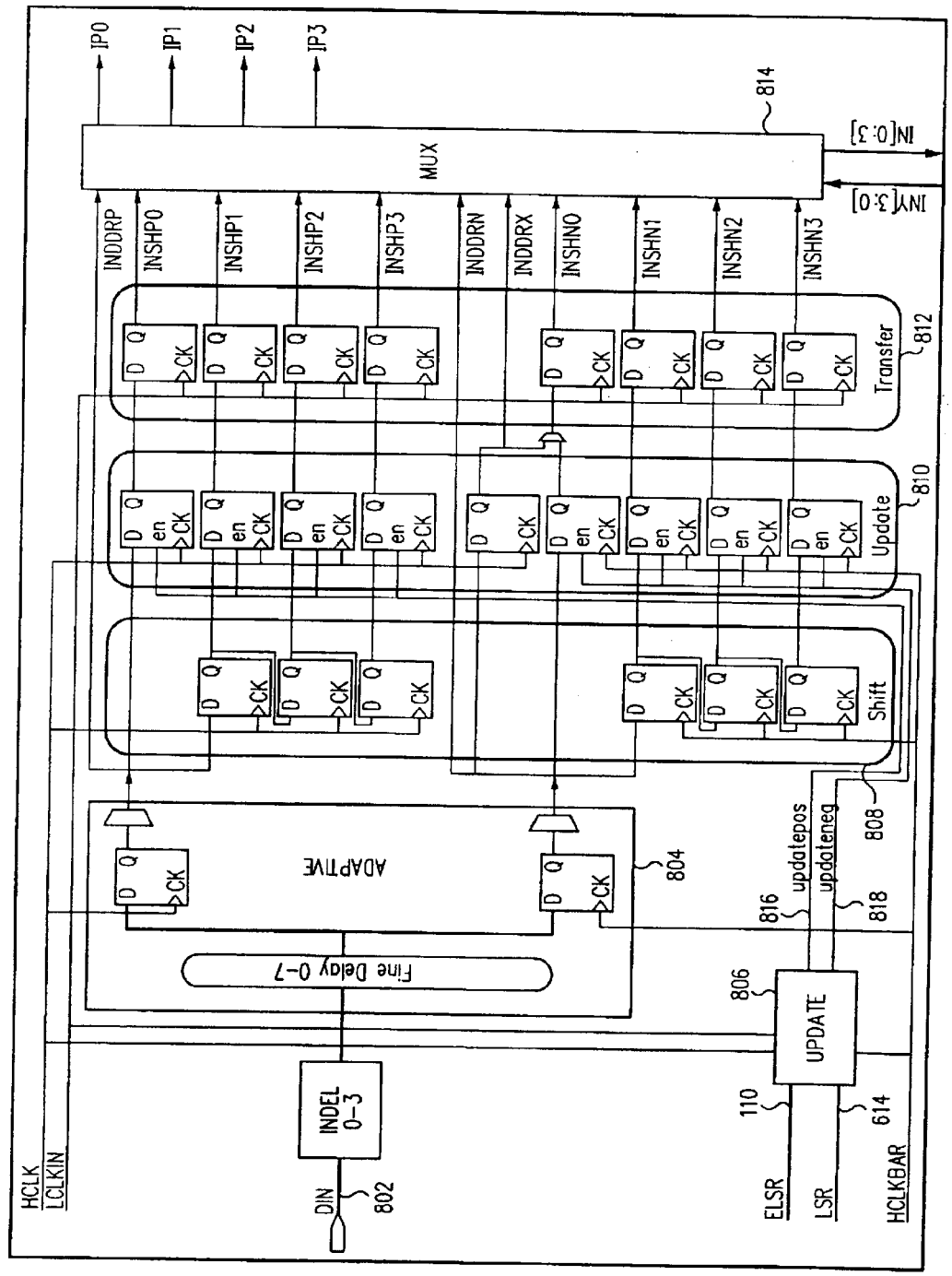
FIG. 8 shows a block diagram illustrating an exemplary data input application for a clock synchronization scheme in accordance with an embodiment of the present invention.

As shown in FIG. 7, the update signal (waveform 704) may be generated based on local synchronization signal 628 to synchronize the data entering or leaving the programmable logic device. For example, FIG. 8 shows a block diagram illustrating an exemplary data input application for a programmable logic device in accordance with an embodiment of the present invention.

Data enters the programmable logic device via data line 802 and may be clocked on positive and/or negative clock edges by an adaptive block 804. A column of shift registers 808 shifts in the high speed data to a column of update registers 810, which are clocked with a high speed clock (HCLK, e.g., clock signal 604) but are updated only every second or fourth clock cycle as controlled by update signals 816 and 818 (labeled updatepos and updateneg, respectively, and corresponding to positive and negative edge clocked data). Update signals 816 and 818 are generated by an update block 806, as described in detail below. Update registers 810 transfers the data to a column of transfer registers 812, which are clocked with a low speed clock (LCLKIN, e.g., clock signal 610) and are the interface to the core logic of the programmable logic device (via a multiplexer 814).

Figure 9:
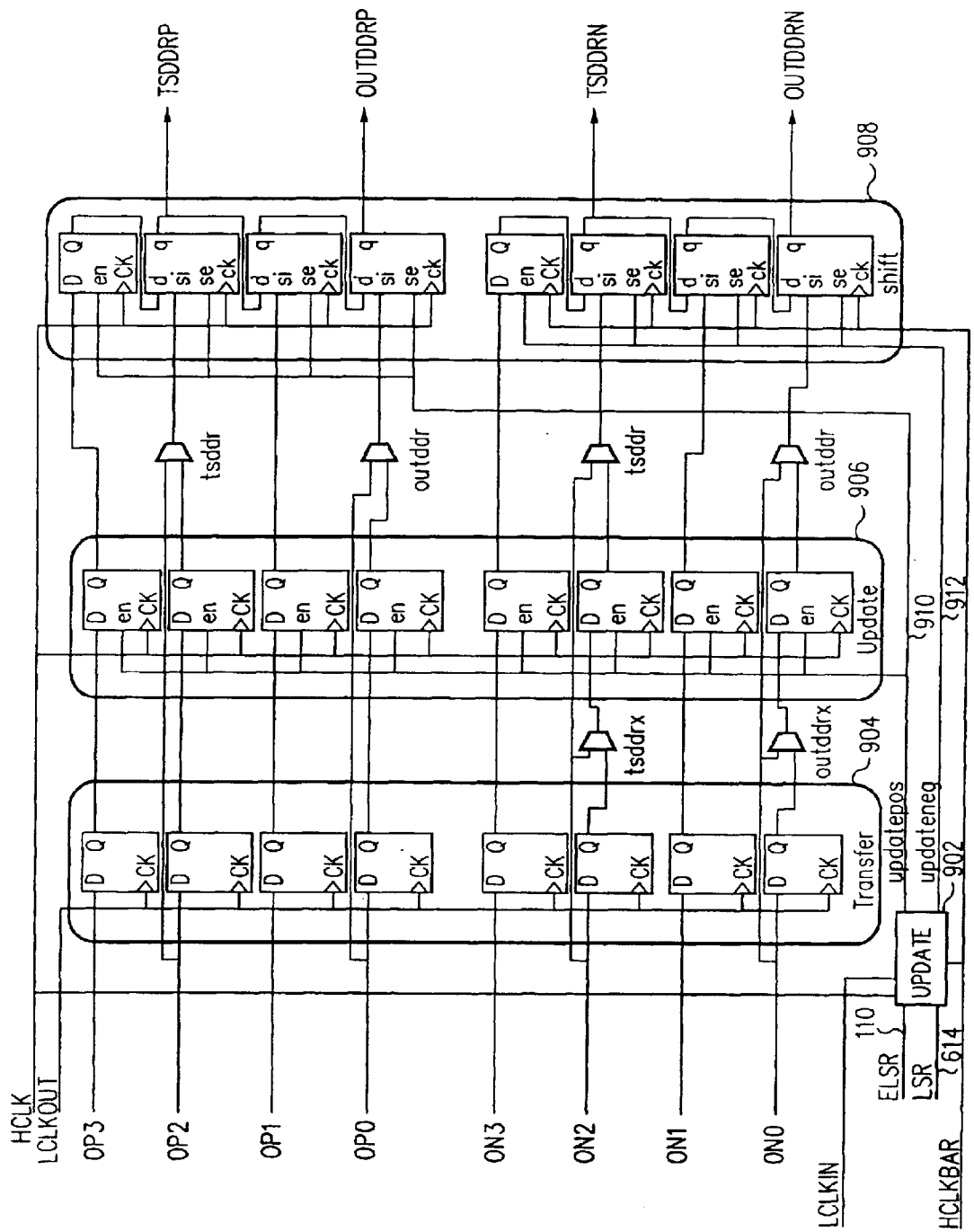
FIG. 9 shows a block diagram illustrating an exemplary data output application for a clock synchronization scheme in accordance with an embodiment of the present invention.

As another example, FIG. 9 shows a block diagram illustrating an exemplary data output application for a programmable logic device in accordance with an embodiment of the present invention. Data transitions from the core logic of the programmable logic device via a column of transfer registers 904, which are clocked at the low speed clock rate (labeled LCLKOUT, clock rate of the core logic), to a column of update registers 906. Update registers 906 are clocked at the high speed clock rate (HCLK) but they load in the data from transfer registers 904 on every second or fourth cycle as controlled by update signal 910, which is generated by an update block 902 (described below). A column of shift registers 908 receive the data from update registers 906 and shift the data (at the high speed clock rate and under the control of update signal 910 and/or update signal 912—e.g., for single or double data rates) out of the programmable logic device (e.g., via output buffers and input/output pads).

Figure 10:
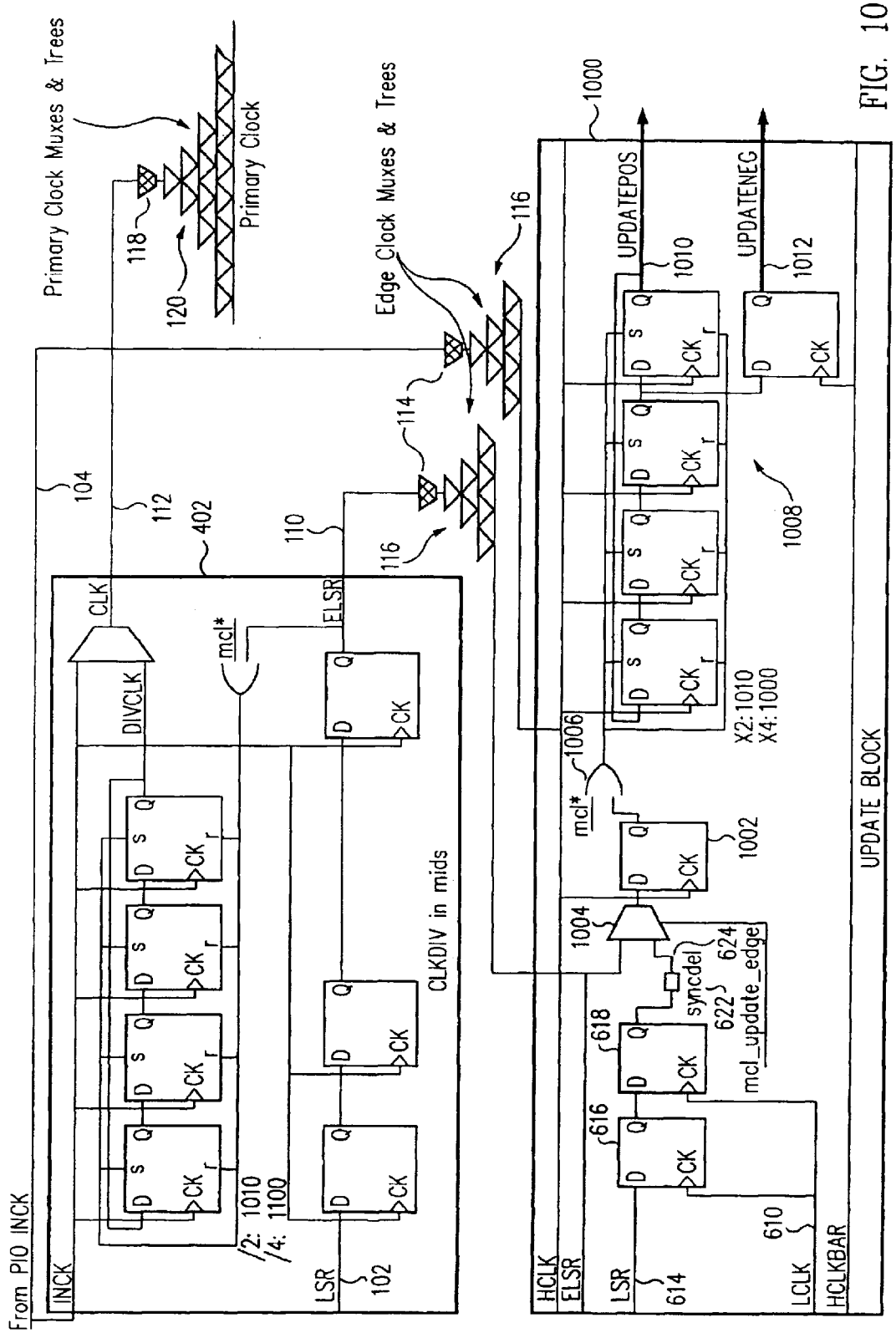
FIG. 10 shows a block diagram illustrating an exemplary circuit for FIG. 8 or 9.

FIG. 10 shows a block diagram that includes an update block 1000, which provides an exemplary circuit for update blocks 806 or 902. Update block 1000 may operate based on techniques and exemplary circuits described in reference to an edge clock distribution scheme (e.g., CSS 100) or in reference to a phasealigned clock distribution scheme (e.g., CSS 600).

Specifically, update block 1000 receives edge clock reset signal 110 and clock signal 104 and also reset signal 614 and clock signal 610 (which may be the same as clock signal 112). A multiplexer 1004 selects between edge clock reset signal 110 and reset signal 624 to utilize for synchronization. Based on the selection, either edge clock reset signal 110 or reset signal 624 is registered by a flip flop 1002 (e.g., functional equivalent to flip flop 626 or flip flop 124) whose output controls the generation of update signals 1010 and 1012 (i.e., update signals 816 and 818 or update signals 910 and 912) via flip flops 1008. Flip flops 1008 may be controlled to provide a divide by two or a divide by four rate adjustment, as discussed similarly above.

Figure 11:
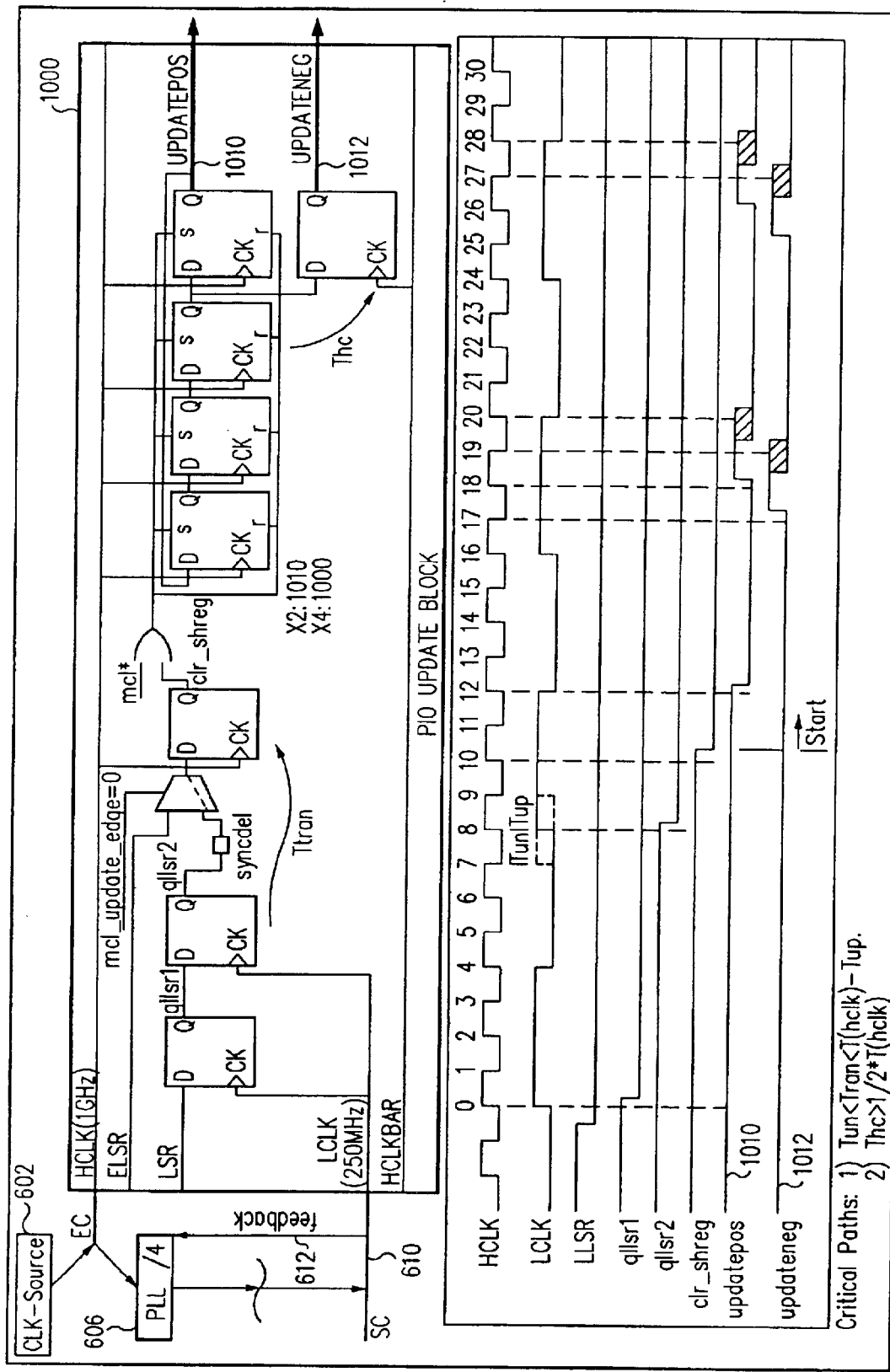
FIG. 11 shows a block diagram illustrating an exemplary circuit and an exemplary timing diagram for FIG. 8 or 9.

FIG. 11 shows a block diagram illustrating an exemplary application and an exemplary timing diagram for update block 1000. Specifically, update block 1000 is utilizing the PLL clock synchronization scheme to generate update signals 1010 and 1012. The corresponding timing diagram in FIG. 11 illustrates an exemplary timing relationship for the various signals.

Figure 12:
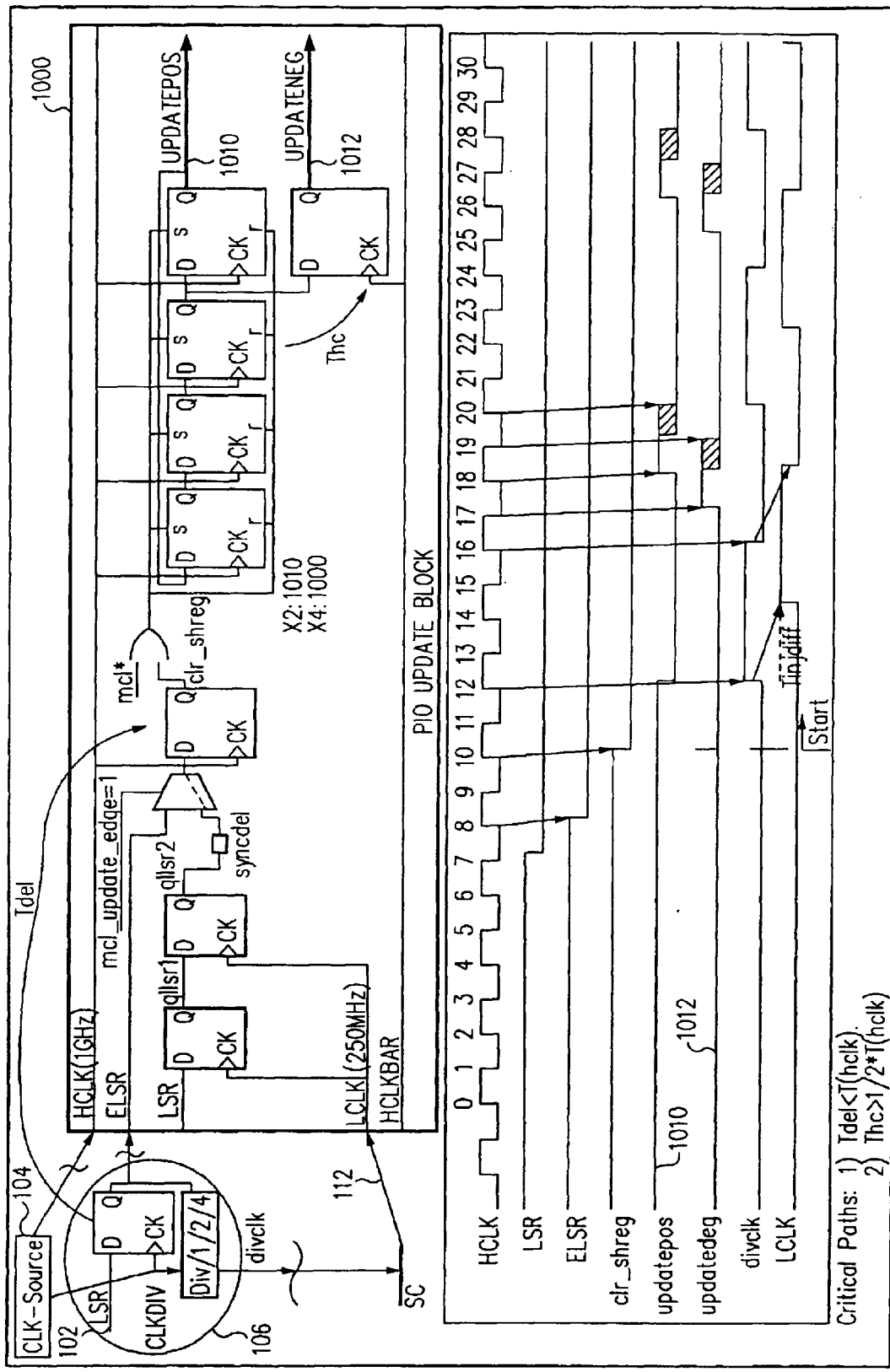
FIG. 12 shows a block diagram illustrating an exemplary circuit and an exemplary timing diagram for FIG. 8 or 9.

FIG. 12 shows a block diagram illustrating an exemplary application and an exemplary timing diagram for update block 1000. Specifically, update block 1000 is utilizing the edge clock synchronization scheme to generate update signals 1010 and 1012. The corresponding timing diagram in FIG. 12 illustrates an exemplary timing relationship for the various signals.

Figure 13:
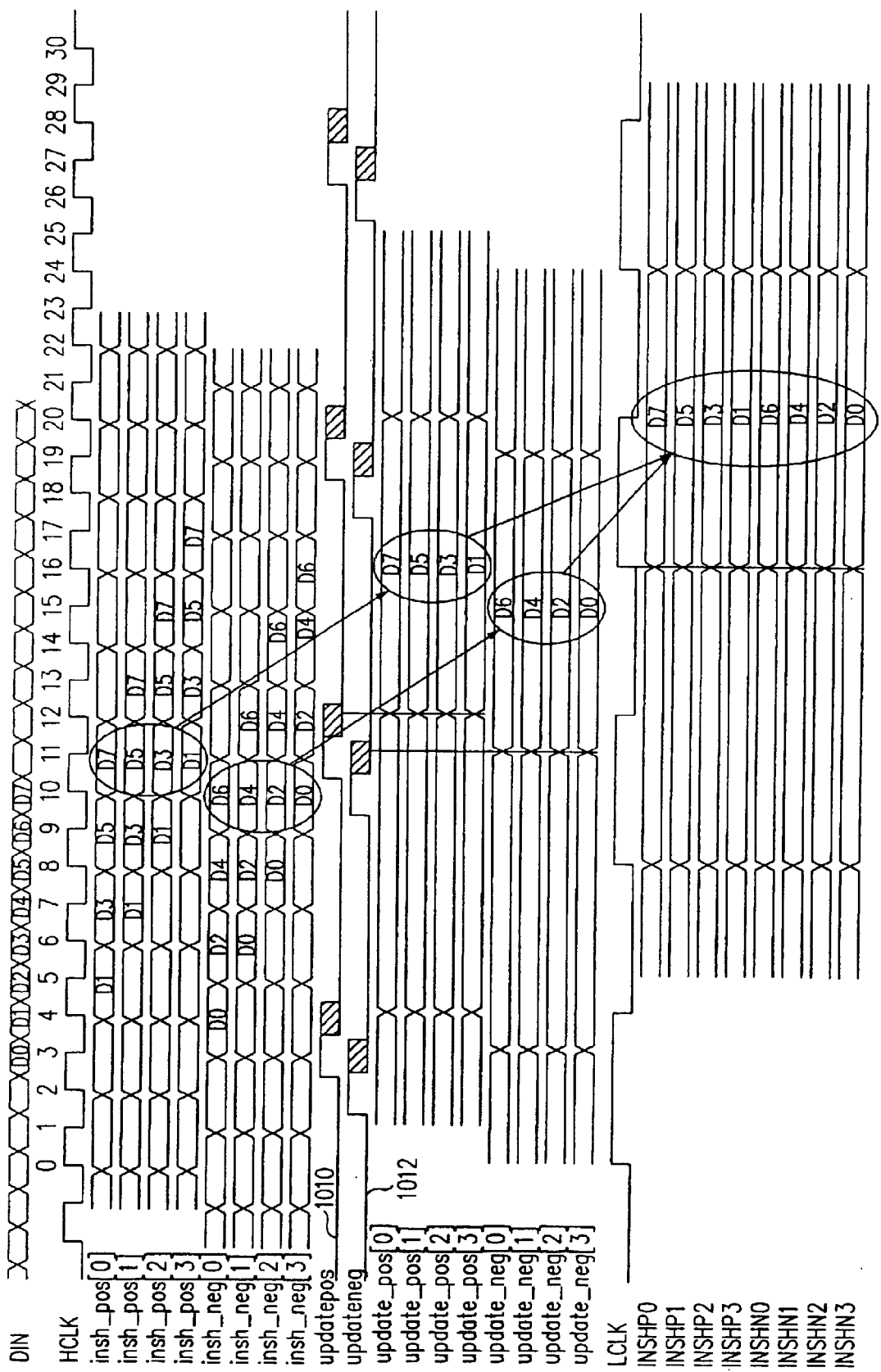
FIG. 13 shows an exemplary timing diagram in accordance with an embodiment of the present invention.
Figure 15:
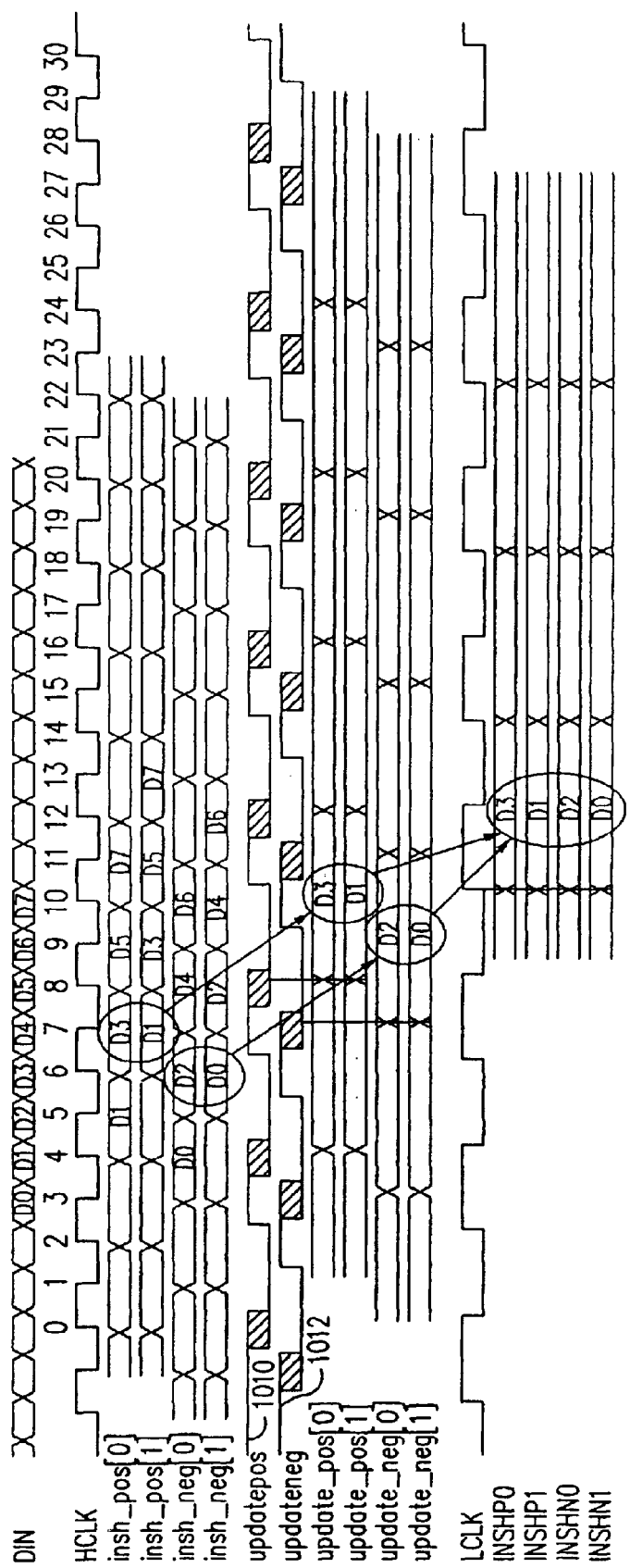
FIG. 15 shows an exemplary timing diagram in accordance with an embodiment of the present invention.

FIG. 13 shows an exemplary timing diagram where data (DIN) is clocked in and shifted into the core logic at a divide by four clock rate. The timing diagram may, for example, illustrate an exemplary timing of the block diagram discussed in reference to FIG. 8 and utilize the PLL synchronization technique as illustrated in FIG. 11 or the edge clock synchronization techniques as illustrated in FIG. 12. FIG. 15 shows an exemplary timing diagram, similar to FIG. 13, but where the data is clocked in at a divide by two rate.

Figure 14:
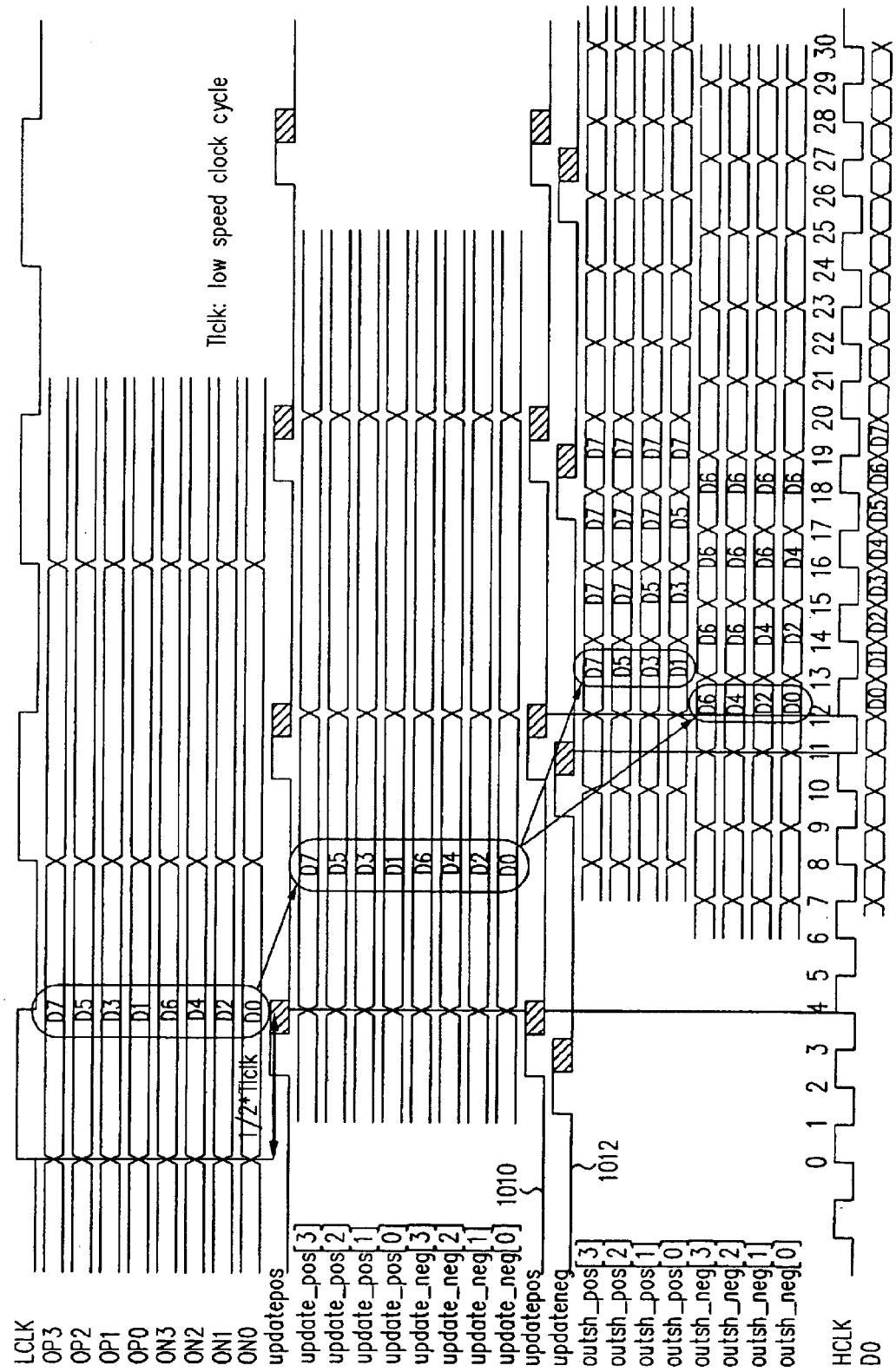
FIG. 14 shows an exemplary timing diagram in accordance with an embodiment of the present invention.

FIG. 14 shows an exemplary timing diagram where data (ON0–ON3, OP0–OP3) is clocked out and shifted out of the programmable logic device at a divide by four clock rate. The timing diagram may, for example, illustrate an exemplary timing of the block diagram discussed in reference to FIG. 9 and utilizing the PLL synchronization technique as illustrated in FIG. 11 or the edge clock synchronization techniques as illustrated in FIG. 12.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
    a clock divider circuit adapted to receive a first clock signal and a first reset signal and provide a second reset signal synchronized to the first clock signal;
    a plurality of input/output circuits each adapted to receive the second reset signal and the first clock signal and synchronize the second reset signal to the first clock signal to generate a local synchronization signal, wherein the local synchronization signal in each of the plurality of input/output circuits is synchronized to a clock cycle of the first clock signal;
    a first distribution path for the first clock signal, the first distribution path couplable between the clock divider circuit and the plurality of input/output circuits; and
    a second distribution path for the second reset signal, the second distribution path couplable between the clock divider circuit and the plurality of input/output circuits.

2. The programmable logic device of claim 1, wherein the first distribution path and the second distribution path are substantially matched to minimize skew between the first clock signal and the second reset signal.

3. The programmable logic device of claim 1, wherein the first distribution path and the second distribution path each comprise a three level binary tree structure.

4. The programmable logic device of claim 1, wherein the first distribution path and the second distribution path are disposed along an edge of the programmable logic device.

5. The programmable logic device of claim 1, wherein the local synchronization signal is used to synchronize data propagation through the input/output circuit.

6. The programmable logic device of claim 1, wherein the clock divider further generates a second clock signal synchronized to the first clock signal.

7. The programmable logic device of claim 6, wherein the second clock signal has a slower clock rate than the first clock signal and is shifted in phase by 90, 180, or 270 degrees.

8. The programmable logic device of claim 7, wherein the second clock signal travels through a third distribution path which is substantially longer than the first and second distribution paths.

9. A method of synchronizing a plurality of input/output circuits on a programmable logic device, the method comprising:
    receiving a first reset signal and a first clock signal;
    generating a second reset signal synchronized to the first clock signal;
    transmitting the first clock signal and the second reset signal through a first distribution path and a second distribution path, respectively, to the plurality of input/output circuits; and
    synchronizing the second reset signal to the first clock signal at each of the plurality of input/output circuits to generate a local synchronization signal.

10. The method of claim 9, wherein the local synchronization signal in each of the plurality of input/output circuits is synchronized to the same clock cycle of the first clock signal.

11. The method of claim 9, wherein the first distribution path and the second distribution path are matched to minimize skew between the first clock signal and the second reset signal.

12. The method of claim 9, further comprising:
    generating a second clock signal synchronized to the first clock signal; and
    transmitting the second clock signal to core logic of the programmable logic device, wherein the second clock signal is carried by a third distribution path which is substantially matched to the first and second distribution paths to minimize skew between the first and second clock signal and the second reset signal.

13. The method of claim 12, further comprising shifting a phase of the second clock signal by 90, 180, or 270 degrees.

* * * * *